United States Patent
Andoh (10) Patent No.: US 7,123,480 B1
(45) Date of Patent: Oct. 17, 2006

(54) PACKAGE STRUCTURE FOR A SEMICONDUCTOR DEVICE

(75) Inventor: Seiji Andoh, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 345 days.

(21) Appl. No.: 09/376,063

(22) Filed: Aug. 17, 1999

(30) Foreign Application Priority Data

Aug. 18, 1998 (JP) ................................ 10-232126

(51) Int. Cl.
*H05K 7/20* (2006.01)

(52) U.S. Cl. ...................... 361/704; 361/719; 361/760; 257/707; 165/80.3; 174/16.3

(58) Field of Classification Search ................ 361/704, 361/707, 711, 712, 717–719, 760, 767, 768, 361/783, 803, 808; 257/692, 706–727, 737, 257/738, 773, 796, 693, 697, 779, 746, 760, 257/774; 174/16.3, 260, 252, 254; 29/832, 29/841, 859, 852, 840, 846

See application file for complete search history.

(56) References Cited

U.S. PATENT DOCUMENTS

| | | | |
|---|---|---|---|
| 4,460,537 A | 7/1984 | Heinle | |
| 4,924,352 A * | 5/1990 | Septfons | 361/388 |
| 5,011,066 A * | 4/1991 | Thompson | 228/180.2 |
| 5,132,778 A | 7/1992 | Juskey et al. | |
| 5,136,366 A | 8/1992 | Worp et al. | |
| 5,153,385 A | 10/1992 | Juskey et al. | |
| 5,216,278 A * | 6/1993 | Lin et al. | 257/688 |
| 5,285,352 A * | 2/1994 | Pastore et al. | 361/707 |
| 5,490,324 A * | 2/1996 | Newman | 29/830 |
| 5,506,756 A * | 4/1996 | Haley | 361/789 |
| 5,592,025 A | 1/1997 | Clark et al. | |
| 5,616,888 A * | 4/1997 | McLaughlin et al. | 174/260 |
| 5,640,047 A * | 6/1997 | Nakashima | 257/738 |
| 5,640,048 A * | 6/1997 | Selna | 257/738 |
| 5,642,261 A * | 6/1997 | Bond et al. | 361/704 |
| 5,708,566 A * | 1/1998 | Hanninghaus et al. | 361/764 |
| 5,729,432 A * | 3/1998 | Shim et al. | 361/690 |
| 5,729,894 A * | 3/1998 | Rostoker et al. | 29/832 |
| 5,767,575 A * | 6/1998 | Lan | 257/701 |
| 5,864,470 A * | 1/1999 | Shim et al. | 361/777 |
| 5,894,410 A * | 4/1999 | Barrow | 361/760 |
| 5,909,058 A * | 6/1999 | Yano et al. | 257/712 |

(Continued)

FOREIGN PATENT DOCUMENTS

JP      08-70062      3/1996

(Continued)

*Primary Examiner*—Michael Datskovskiy
(74) *Attorney, Agent, or Firm*—Rabin & Berdo, PC (57) ABSTRACT

A package structure for a semiconductor device comprises a substrate having a main surface and a back surface, a semiconductor chip formed on the main surface of the substrate, a package covering the semiconductor chip, radiation protrude electrodes and connection protrude electrodes. The radiation protrude electrodes are formed on the back surface of the substrate in a chip area where said semiconductor chip is located. Each of the radiation protrude electrodes are formed with a first pitch so that the radiation protrude electrodes make one body joining layer when the package structure is subjected to a heat treatment. The connection protrude electrodes are formed on the back surface of the substrate in a peripheral area of the chip area. Each of the connection protrude electrodes formed with a second pitch which is larger than the first pitch so that the connection protrude electrodes stay individual when the package structure is subjected to a heat treatment.

9 Claims, 5 Drawing Sheets

U.S. PATENT DOCUMENTS

| | | | | |
|---|---|---|---|---|
| 6,037,656 | A | * | 3/2000 | Sugahara .................... 257/697 |
| 6,046,499 | A | * | 4/2000 | Yano et al. ................. 257/712 |
| 6,057,596 | A | * | 5/2000 | Lin et al. .................... 257/697 |
| 6,084,295 | A | * | 7/2000 | Horiuchi et al. ............ 257/690 |
| 6,194,782 | B1 | * | 2/2001 | Katchmar ................... 257/738 |
| 6,225,702 | B1 | * | 5/2001 | Nakamura ................. 257/786 |
| 6,268,568 | B1 | * | 7/2001 | Kim ........................... 174/250 |
| 6,282,094 | B1 | * | 8/2001 | Lo et al. ..................... 361/704 |
| 6,294,407 | B1 | * | 9/2001 | Jacobs ....................... 438/118 |
| 6,359,341 | B1 | * | 3/2002 | Huang et al. ............... 257/778 |

FOREIGN PATENT DOCUMENTS

| | | |
|---|---|---|
| JP | A-08-097322 | 4/1996 |
| JP | 409321188 A * | 12/1997 |

* cited by examiner

PACKAGE STRUCTURE FOR A SEMICONDUCTOR DEVICE

BACKGROUND OF THE INVENTION

The present invention relates to a package structure for a semiconductor device, and more particularly, it relates to a package structure having radiation solder bumps and connection solder bumps on a back surface of the package structure.

A conventional semiconductor device includes a package for covering a semiconductor chip, a substrate having a main surface on which the semiconductor chip is formed and radiation solder bumps and connection solder bumps formed on the back surface of the substrate.

The radiation solder bumps are formed in the center area of the back surface of the substrate. The connection solder bumps are formed in the peripheral area which surrounds the center area of the substrate. The connection solder bumps are electrically connected to electrodes of the semiconductor chip through conductive lines formed in the substrate. Therefore, the connection solder bumps have a function as terminals for connecting the semiconductor device to an outside circuit.

When the semiconductor device is mounted on a circuit board, the semiconductor device is subjected to a heat treatment (it is called as a reflow stop). The circuit board has radiation pads located in corresponding position to the radiation solder bumps and connection pads located in corresponding position to the connection solder bumps. The radiation solder bumps and connection solder bumps are malted by the heat treatment so that both of the solder bumps are connected and joined to the pads, respectively. Therefore, the semiconductor device is fixed on the circuit board.

Each of the connection solder bumps should be connected to one of the connection pads independently. Therefore, the connection solder bumps are formed with a predetermined pitch so that the adjacent connection solder bumps should not joined each other by the heat treatment (it is called as a solder bridge).

The radiation bumps which are not connected to the electrodes of the semiconductor chip are formed with the same pitch of the connection solder bumps. The heat energy generated by the semiconductor chip in the package is transferred to the circuit board through a thermal conduction part including the radiation bumps and radiation pads. The transferred heat energy is diffused in the circuit board and outgoing from the circuit board.

Since the radiation solder bumps are formed with the same pitch of the connection solder bumps, a cross sectional area of the thermal conduction part is relatively small and a coefficient of thermal conductivity thereof is low.

SUMMARY OF THE INVENTION

The present invention is done in consideration of the problems of the conventional semiconductor device. The object of the present invention is to provide a now and improved semiconductor device including protruding radiation electrodes which improve the thermal conductivity coefficient of the semiconductor device.

To solve the issues of the conventional semiconductor device, a package structure for a semiconductor device comprises a substrate having a main surface and a back surface, a semiconductor chip formed on the main surface of the substrate, a package covering the semiconductor chip, protruding radiation electrodes and protruding connection electrodes. The protruding radiation electrodes are formed on the back surface of the substrate in a chip area where the semiconductor chip is located. Each of the protruding radiation electrodes are formed with a first pitch so that the protruding radiation electrodes make one body joining layer when the package structure is subjected to heating treatment. The protruding connection electrodes are formed on the back surface of the substrate in a peripheral area of the protruding chip area. Each of the connection electrodes formed with a second pitch which is larger than the protruding first pitch so that the connection electrodes remain separated when the package structure is subjected to a heat treatment.

DESCRIPTION OF THE PREFERRED EMBODIMENTS

The preferred embodiment of the present invention will be explained in detail with reference to the accompanying drawings.

Figure 1:
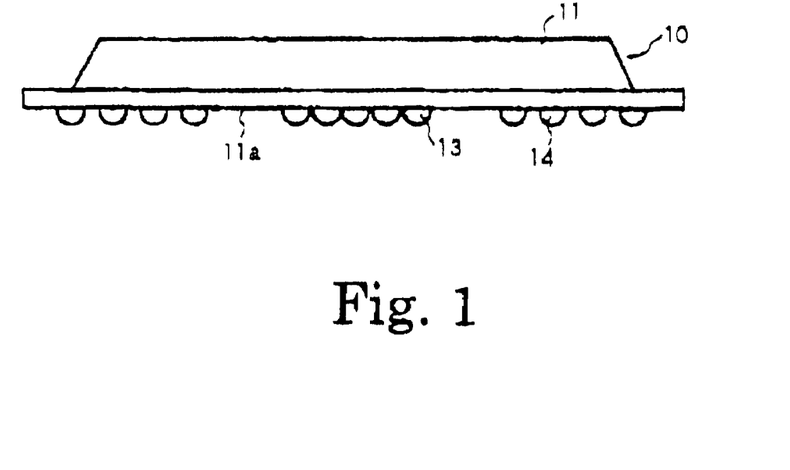
FIG. 1 is a side elevation view of a semiconductor device according to the first embodiment of the present invention.

The first embodiment is described referring to FIGS. 1 through 6. FIG. 1 is a side elevation view of a semiconductor device according to the first embodiment of the present invention. A semiconductor device 10 according to the first embodiment of the present invention includes a package 11 in which a semiconductor chip (not shown in FIG. 1) is molded. The semiconductor device 10 includes a substrate 11a having a main surface on which the package 11 and the semiconductor chip are formed. The semiconductor device 10 further includes radiation solder bumps 13 and connection solder bumps 14 formed on a back surface of the substrate 11a.

Figure 2:
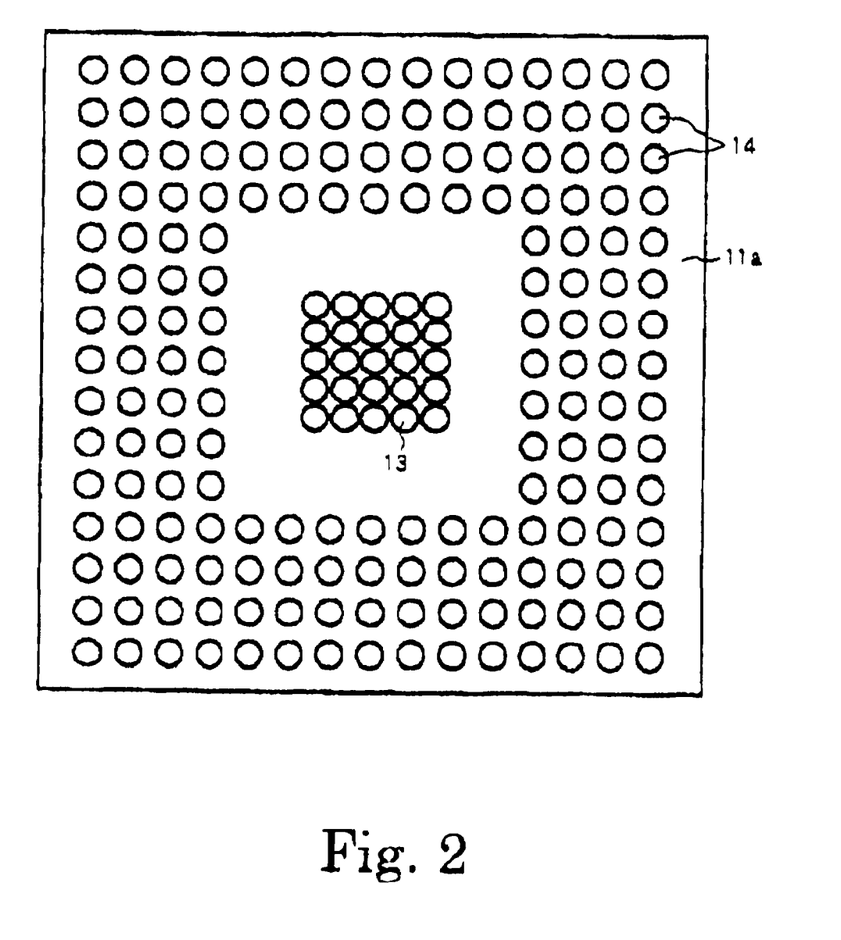
FIG. 2 is a bottom plan view of the semiconductor device according to the first embodiment of the present invention.

As shown in FIG. 2, the radiation solder bumps 13 are located in the central region of the back surface of the substrate 11a. Surrounding the central region is an intermediate region in which no solder bumps are located. The connection solder bumps 14 are located in a peripheral region which surrounds the intermediate region of the back surface of the substrate 11a. The connection solder bumps 14 are electrically connected to electrodes of the semiconductor chip through conductive lines formed in the substrate, respectively. Therefore the connection solder bumps 14 function as terminals for connecting the semiconductor device to an outside surface.

Figure 5:
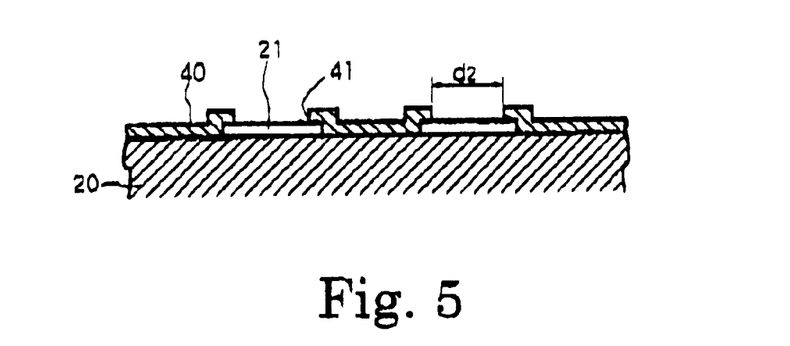
FIG. 5 is a fragmentary sectional view of the circuit board used in the first embodiment of the present invention.
Figure 6:
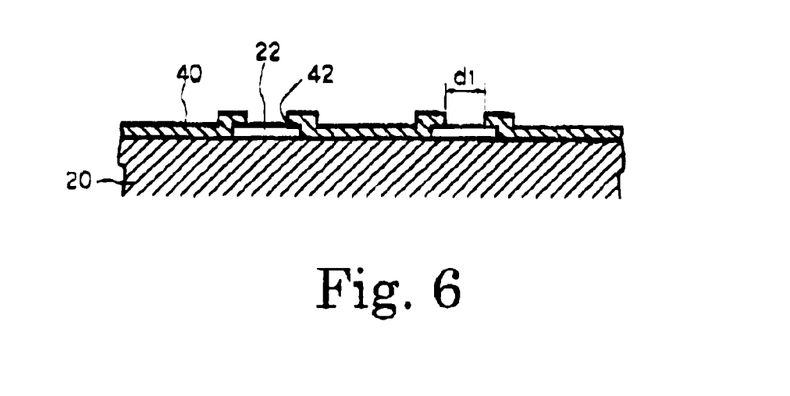
FIG. 6 is another fragmentary sectional view of the circuit board used in the first embodiment of the present invention.

When the semiconductor device 10 is mounted on a circuit board, first, the semiconductor device 10 is put on the circuit board 20. The circuit board 20 has radiation pads 21 located in corresponding position to the radiation solder bumps 13 as shown in FIG. 5. The circuit board 20 further has connection pads 22 located in corresponding position to the connection solder bumps 14 as shown in FIG. 6. Then, the semiconductor device and the circuit board are subjected to a heat treatment (reflow step). The radiation solder bumps 13 and connection solder bumps 14 are melted by the heat treatment so that both of the solder bumps 13, 14 are connected and joined to the radiation pads 21 and the connection pads 22, respectively. Therefore, the semiconductor device 10 is fixed on the circuit board 20.

Since each of the connection solder bumps 14 is connected to one of the electrodes of the semiconductor chip, the connection solder bumps 14 should be connected to the connection pads 22 individually. Therefore, as shown in FIGS. 1 and 2, the connection solder bumps are located with a predetermined pitch or distance so that the adjacent connection bumps 14 should not joined together by the heat treatment (the joining of bumps is called as a solder bridge). FIGS. 1 and 2 also show that the width of the intermediate region is greater than the distance between the connection solder bumps 14.

Figure 3:
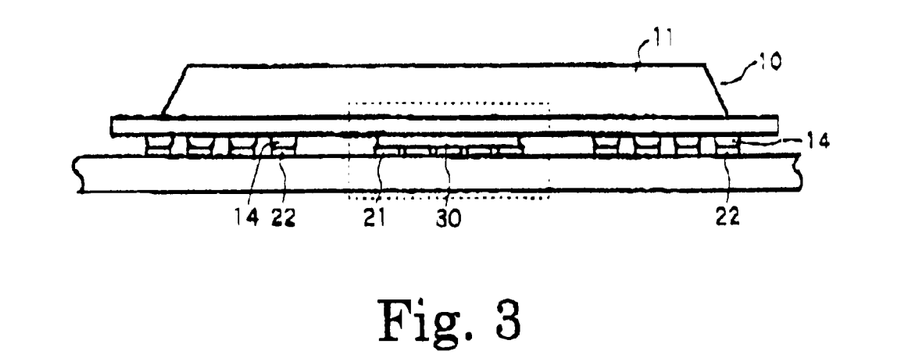
FIG. 3 is a side elevation view of the semiconductor device and a circuit board according to the first embodiment of the present invention.
Figure 4:
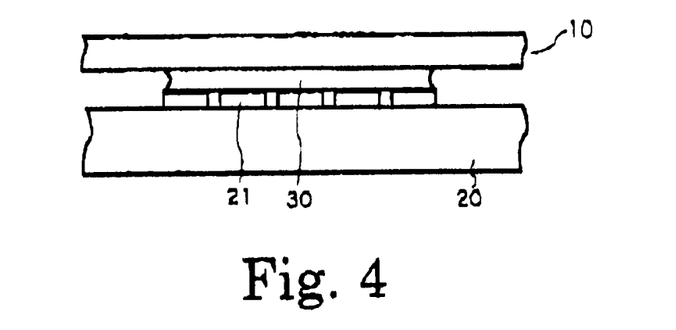
FIG. 4 is an enlarged elevation view of the semiconductor device and the circuit board shown in FIG. 3.

On the other hand, the radiation solder bumps 13 are located with a smaller pitch or distance than that of the connection solder bumps' as shown in FIGS. 1 and 2. Therefore, the radiation solder bumps 13 are joined together to form a solder bridge by the heat treatment, as a result, the radiation bumps form a one body connection layer 30 as shown in FIG. 3. In the first embodiment, the connection layer 30 for an outgoing radiation is connected to the individual radiation pads 21.

For example, diameter of the radiation solder bumps 13 and the connection solder bumps 14 is 0.75 mm, the pitch or distance between the radiation solder bumps 13 is 1.00 mm and the pitch or distance between the connection solder bumps 13 is 1.27 mm. Preferably, the pitch or distance between the radiation solder bumps 13 is 1 to 1.4 times greater than the diameter of the radiation solder bumps 13. Also, the pitch or distance between the connection solder bumps 14 is 1.6 to 1.7 times greater than the diameter of the connection solder bumps 14.

In the structure shown in FIG. 3, heat energy generated in the semiconductor chip during the operation is transferred to the circuit board 20 through the connection layer 30. The transferred heat energy is diffused in the circuit board 20 and outgoing from the circuit board 20. At this time, since a thermal conduction part from the semiconductor device 10 to the circuit board 20 is comprised of a joining connection layer 30, an effective area ratio for outgoing radiation is higher than that of the conventional semiconductor device structure. Therefore, radiation efficiency of the semiconductor device according to the first embodiment of the present invention is improved.

For the purpose of joining the adjacent radiation solder bumps 13 easily, a ratio of the effective area of the radiation pads 21 to all area thereof should be higher than a ratio of the effective area of the connection pads 22 to all area thereof. For example, as shown in FIGS. 5 and 6, a solder resist layer 40 having openings 41 and 42 are formed on the surface of the circuit board 20. In such case, the opening 41 for the radiation pad 21 should have larger diameter d2 (shown in FIG. 5) than a diameter d1 of the opening 42 for the connection pad 22 as shown in FIG. 6.

The diameter d1 of the opening 42 for the connection pads 22, that is an effective area ratio, is determined so that the adjacent connection solder bumps are not joined to each other. On the other hand, the effective area ratio for the radiation pads 21 is set to higher than that for the connection pads 22 so as to form the solder bridge easily. Where the diameter of the opening 41 is relatively bigger, the diameter of the radiation bumps 13 can be bigger and the solder bridge is easily formed.

Figure 7:
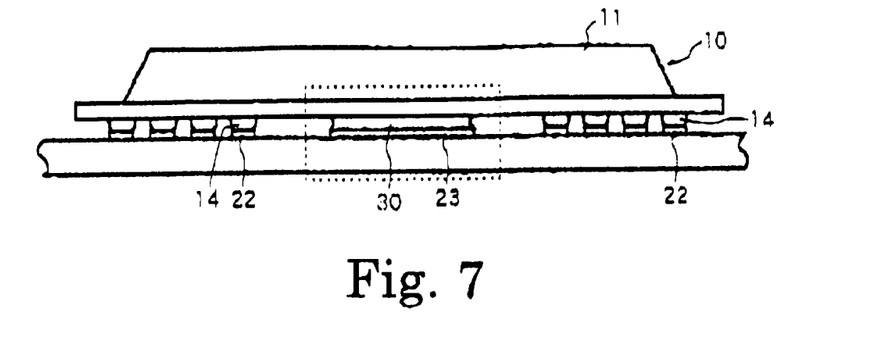
FIG. 7 is a side elevation view of a semiconductor device and a circuit board according to the second embodiment of the present invention.
Figure 8:
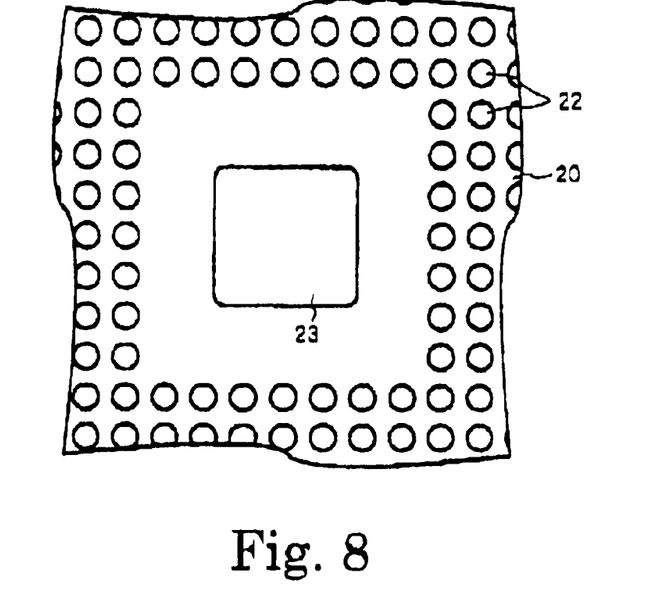
FIG. 8 is a bottom plan view of the semiconductor device according to the second embodiment of the present invention.
Figure 9:
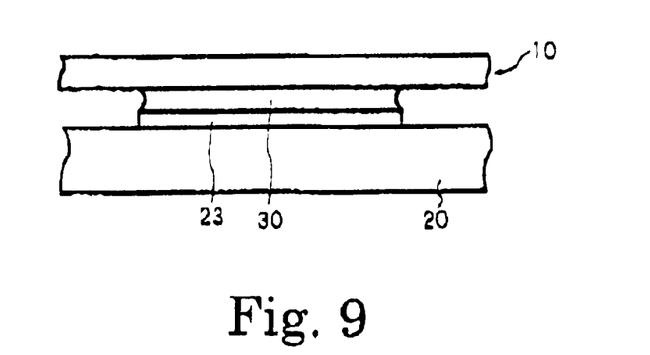
FIG. 9 is an enlarged elevation view of the semiconductor device and the circuit board shown in FIG. 7.

FIG. 7 is a side elevation view of a semiconductor device and a circuit board according to the second embodiment of the present invention. FIG. 8 is a bottom plan view of the semiconductor device according to the second embodiment of the present invention. FIG. 9 is an enlarged elevation view of the semiconductor device and the circuit board shown in dotted square in FIG. 7. In the second embodiment, the semiconductor 10 has the same structure of the first embodiment. The circuit board 20 of the second embodiment has a radiation pad 23 having a wide continued area covering the central area of the back surface of the substrate 11a.

In the second embodiment, the connection layer 30 of the semiconductor device 10 is joined with the radiation pads entirely. Therefore, thermal conduction efficiency between the connection layer 30 and the circuit board 20 is larger than that of the first embodiment. So, the heat energy generated in the semiconductor chip is transferred to the circuit board effectively.

Figure 10:
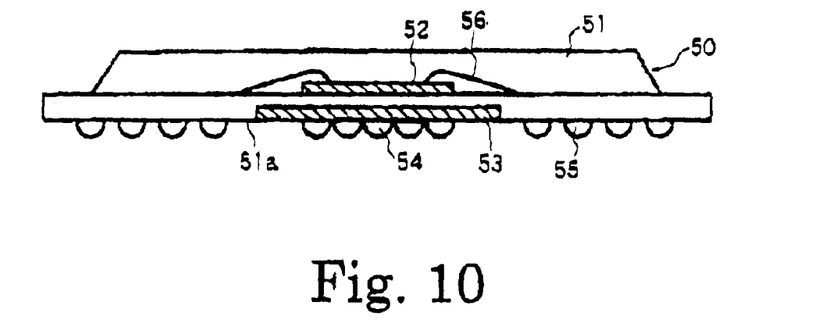
FIG. 10 is a sectional view of a semiconductor device according to the third embodiment of the present invention.

FIG. 10 is a sectional view of a semiconductor device 50 according to the third embodiment of the present invention. In the third embodiment, a substrate 51a has a radiation board 53 in the central area on the back side thereof. The radiation board has a high thermal conductivity coefficient for transferring heat energy from a semiconductor chip 52 molded by the package 51 to radiation solder bumps 54 which are formed on the radiation board 53. The connection solder bumps are formed in the peripheral area of the substrate 51a. Bonding wires 56 connect the electrodes of the semiconductor chip 52 and the conductive lines formed in the substrate 51a, respectively. As explained in the first embodiment, each of the conductive lines is connected to the connection solder bumps 55, respectively. The pitches or distances between the radiation solder bumps 54 and between the connection solder bumps 55 are the same as in the first embodiment.

In the third embodiment, the heat energy generated in the semiconductor chip 52 is effectively transferred to the radiation solder bumps 54 through the radiation board 53. When the radiation solder bumps 54 are turned to the connection layer by the heat treatment and the connection layer is connected to the circuit board, higher radiation efficiency than that of the first embodiment is obtained.

Figure 11:
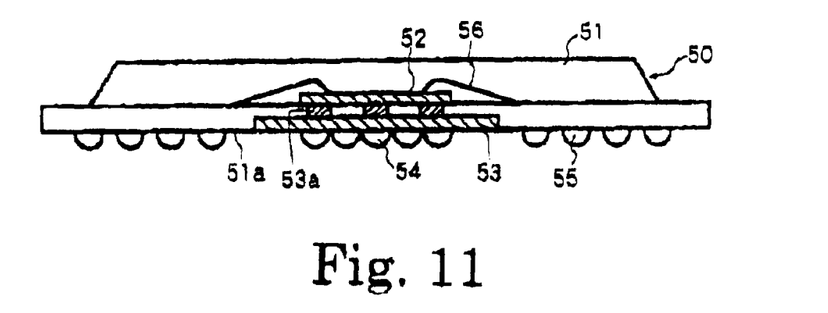
FIG. 11 is a sectional view of a semiconductor device according to the fourth embodiment of the present invention.

FIG. 11 is a sectional view of a semiconductor device 50 according to the fourth embodiment of the present invention.

The semiconductor device 50 of the fourth embodiment further includes a transit portion 53a in addition to the semiconductor device of the third embodiment. The transit portion 53a directly contacts to a semiconductor chip 52 and a radiation board 53. The transit portion 53a is formed of a material having high coefficient of thermal conductivity coefficient. Other portions of the fourth embodiment are the same as in the third embodiment.

In the fourth embodiment the energy generated in the semiconductor chip 52 is transferred to the radiation board 53 through the transit portion 53a. Therefore, higher radiation efficiency than that of the third embodiment is obtained.

Figure 12:
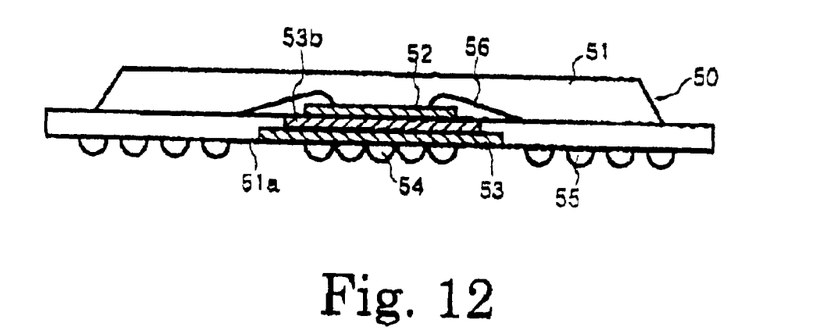
FIG. 12 is a sectional view of a semiconductor device according to the fifth embodiment of the present invention.

FIG. 12 is a sectional view of a semiconductor device 50 according to the fifth embodiment of the present invention. The semiconductor device 50 of the fifth embodiment has a plane transit portion 53b instead of the transit portion 53a of the fourth embodiment. The piano transit portion 53b directly contacts a semiconductor chip 52 and a radiation board 53. The plane transit portion 53b is formed of a material having high thermal conductivity coefficient of other portions of the fifth embodiment the same as in the fourth embodiment.

In the fourth embodiment, the energy generated in the semiconductor chip 52 is transferred to the radiation board 53 through the plane transit portion 63b. Since the plane transit portion 53b contacts to the semiconductor chip 52 and the radiation board 53 with larger area than the transit portion 53a, higher radiation efficiency than that of the fourth embodiment is obtained.

Further, the semiconductor chip 52 can directly contact the radiation board 53 without the transit portion 53b in this case, the semiconductor chip 52 is joined with the radiation board 53 by die bonding material.

Figure 13:
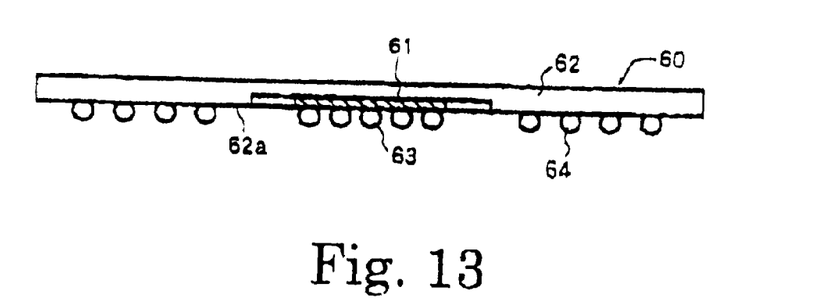
FIG. 13 is a sectional view of a semiconductor device according to the sixth embodiment of the present invention.

FIG. 13 is a sectional view of a semiconductor device 60 according to the sixth embodiment of the present invention. In the sixth embodiment, the semiconductor device 60 has a substrate 62 having a recess on the back surface 62a thereof. The semiconductor chip 61 is mounted in the recess of the substrate 62 by the chip-on board mounting (COB) method so that electrodes of the semiconductor chip are connected to conductive lines (not shown in FIG. 13) formed in the substrate 62. Radiation solder bumps 63 are formed on the back surface of the semiconductor chip 61 directly. Connection solder bumps 64 are formed on the back surface 62a of the substrate 62 in order to be connected to the conductive lines, respectively. The pitches or distances between the radiation solder bumps 63 and between the connection solder bumps 64 are the same to the first embodiment.

In the sixth embodiment, the heat energy generated in the semiconductor chip 61 is directly transferred to the radiation solder bumps 63.

Figure 14:
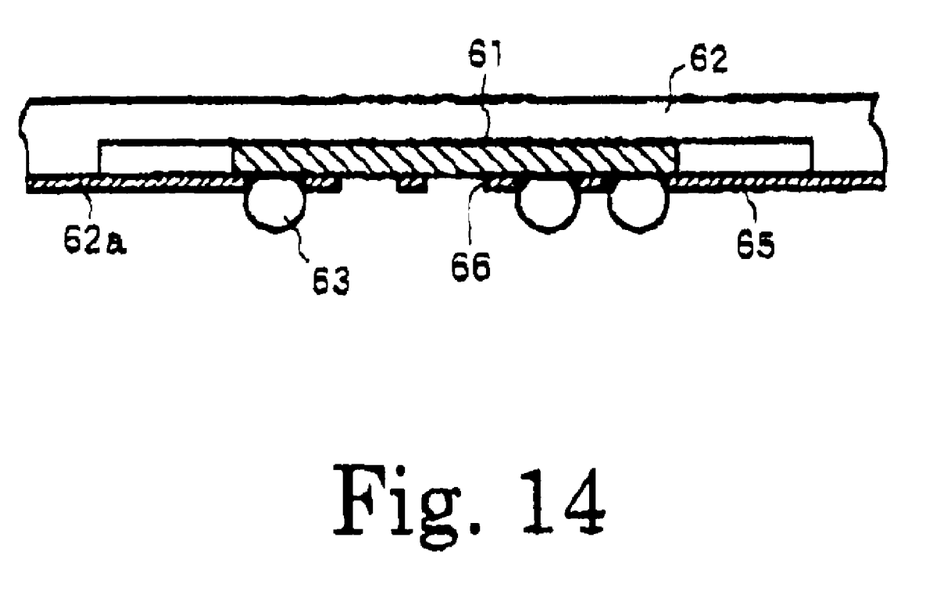
FIG. 14 is a sectional view of the semiconductor device according to the seventh embodiment of the present invention.

FIG. 14 is a sectional view of the semiconductor device according to the is seventh embodiment of the present invention. In the seventh embodiment, a peripheral area of the substrate 62 and connection solder bumps have the same structure of the sixth embodiment. Therefore, explanation of these portions are omitted from the drawing (FIG. 14) and the specification.

In the seventh embodiment, a solder resist layer 65 having openings 66 is formed on the back surface of the semiconductor 61 and the back surface 62a of the substrate 62. The opening are located to the corresponding positions for the radiation solder bumps 63 (located on the back surface of the semiconductor ship 61) and for the connection solder bumps (not shown; located in the peripheral area of the back surface 62a of the substrate 62). As shown in FIG. 14, the radiation solder bumps 63 are formed at the designed position which is led from the opening 66. The radiation solder bumps 63 are positioned closely each other for joining in one body during the heat treatment. Where the position of the radiation solder bumps 63 is deviated from the designed position, the solder bumps 63 are joined before the heat treatment. In such case, a height of the joined radiation solder bumps 63 turns low and such bumps may not contact the circuit board. However, in the seventh embodiment, the radiation solder bumps 63 are formed at the position of the opening 66 of the solder resist layer 65 so that the radiation solder bumps 63 are formed in the designed positions and the radiation solder bumps 63 have the same height. Therefore, the radiation solder bumps 63 of the seventh embodiment can contact the circuit board surely.

As explained above, according to the present invention, the semiconductor device has radiation protrude electrodes joining to one body connection layer by the heat treatment. Therefore, effective area for outgoing radiation is increased and radiation efficiency is improved.

Although the present invention has been described with reference to illustrative embodiments thereof, it should be understood that numerous other modifications and embodiments can be devised by those skilled in the art that will fall within the scope and spirit of the principles of the invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. A semiconductor device, comprising:
   a substrate having a main surface and a back surface,
   wherein said back surface has a central area, a distinct intermediate area in which no bumps are disposed, surrounding said central area, and a peripheral area surrounding said intermediate area;
   a semiconductor chip disposed on said main surface;
   a first bump unit disposed in said central area of said back surface,
   wherein said first bump unit includes a plurality of bumps that are disposed a first distance apart from each other, and
   wherein said first bump unit radiates heat from said semiconductor device; and
   a second bump unit formed in said peripheral area of said back surface,
   wherein said second bump unit includes a plurality of bumps that are disposed a second distance apart from each other, said second distance is greater than said first distance, and said second distance is less than a third distance between said central area and said peripheral area, and
   wherein said second bump unit transmits signals.

2. The semiconductor device in accordance with claim 1, wherein a width of said intermediate area of said back surface is greater than said second distance.

3. The semiconductor device in accordance with claim 2, wherein said plurality of bumps included in said second bump unit is greater in quantity than said plurality of bumps included in said first bump unit.

4. The semiconductor device in accordance with claim 3, wherein said plurality of bumps included in said first bump unit and said second bump unit are spherical in shape.

5. A semiconductor device, comprising:

a substrate having a main surface and a back surface, the back surface having a central area, a distinct intermediate area in which no bumps are disposed, surrounding the central area, and a peripheral area surrounding the intermediate area;

a semiconductor chip disposed on the main surface;

a first bump unit disposed in the central area of the back surface to radiate heat from the semiconductor device, the first bump unit including a plurality of bumps disposed a first distance apart from each other; and a second bump unit formed in the peripheral area of the back surface for transmitting signals, the second bump unit including a plurality of bumps disposed a second distance apart from each other, the second distance being greater than the first distance and less than a third distance between the central area and the peripheral area, wherein the first and second distances are set such that upon application of a heat treatment to the device for the purpose of mounting the device to a circuit board, the bumps of the first bump unit melt so as to become connected and fuse to each other as a unitary body and the bumps of the second bump unit melt and remain apart from each other.

6. The semiconductor device according to claim 5, wherein the bumps of the first and second bump units are formed of solder.

7. A semiconductor device, comprising:

a substrate having a main surface and a back surface, the back surface having a central area, a distinct intermediate area in which no bumps are disposed, surrounding the central area, and a peripheral area surrounding the intermediate area;

a semiconductor chip disposed on the main surface;

a first bump unit disposed in the central area of the back surface to radiate heat from the semiconductor device, the first bump unit including a plurality of bumps disposed a first distance apart from each other; and a second bump unit formed in the peripheral area of the back surface for transmitting signals, the second bump unit including a plurality of bumps disposed a second distance apart from each other sufficient to assure that upon application of a heat treatment to the device for the purpose of mounting the device to a circuit board, causing the bumps of the first and second bump units to melt, the bumps of the second bump unit remain apart from each other, the second distance being greater than the first distance and less than a width of the intermediate area;

wherein the bumps of the first bump unit are sufficiently close to each other that upon the application of the heat treatment to the device, the bumps of the first bump unit fuse into a unitary body.

8. The semiconductor device according to claim 5, wherein the bumps of the first and second bump units are formed of solder.

9. The semiconductor device according to claim 4, wherein the first distance is about 1 to 1.4 times the diameter of the bumps of the first bump unit, and the second distance is about 1.6 to 1.7 times the diameter of the bumps of the second bump unit.

* * * * *